Feb. 21, 1961 P. D. HUME 2,972,720

AUTOMATIC FREQUENCY CONTROL APPARATUS

Filed Sept. 24, 1957

WITNESSES:
Bernard R. Giegucz
Wm. B. Sellers

INVENTOR
Peter D. Hume
BY Maury I. Hull
ATTORNEY

United States Patent Office 2,972,720

Patented Feb. 21, 1961

2,972,720

AUTOMATIC FREQUENCY CONTROL APPARATUS

Peter D. Hume, Round Bay, Md., assignor to Westinghouse Electric Corporation, East Pittsburgh, Pa., a corporation of Pennsylvania Filed Sept. 24, 1957, Ser. No. 685,924

8 Claims. (Cl. 331—4)

This invention relates to an improvement in automatic frequency control apparatus, and more particularly to such apparatus of the hunting, absolute-frequency type.

Prior art hunting automatic frequency control circuits having an oscillator which sweeps over a large band of frequencies in order to find the correct operating point or correct operating frequency and thereafter automatically lock on the desired frequency are characterized by a number of disadvantages. Such circuits, as is well known in the art, usually employ either a phase detector or a discriminator as the error sensing cricuit.. Where a discriminator is employed, the correcting voltage must, however, be derived from a frequency error, and the use of a discriminator finds widest applications in automatic frequency control systems of the difference-frequency type, such for example, as in a superheterodyne receiver, where errors in the intermediate frequency are used to control the local oscillator. Where a phase detector is employed, the correcting voltage, is derived from a change in phase angle and represents no frequency error, but there are certain limitations in the prior art upon the use of a phase detector. In the past, it has proved impractical to provide a phase detector circuit which would lock-in over a frequency range as wide as that over which it held control when once locked in. Where means have been employed to overcome this difficulty, they have themselves offered certain disadvantages; for example, a discriminator can be connected in parallel with the phase detector, but if the reference frequency is changing the discriminator frequency must be tracked with it which is difficult in practice. A sweep voltage generator may be used which varies the value of a controlled reactance and thereby varies the oscillator frequency until it is close enough to lock in, but sensing elements are required to determine when lock-in has occurred, and in practice it has proved difficult to turn off the sweep generator without introducing a transient which unlocks the system again.

This invention relates to an automatic frequency control circuit employing a phase detector which automatically turns a sweep voltage on and off without the use of additional sensing elements, and in which there is provided a simplified circuit arrangement for the generation of the sweep voltage, a direct current amplifier in conjunction with a phase reversing feedback tube being utilized for this purpose. The apparatus of the instant invention also incidentally turns the sweep voltage off without introducing substantial transients into the circuit.

The invention further provides for the use of a phase detector having a voltage of a reference frequency applied thereto as one input and a voltage of the oscillator frequency to be controlled applied thereto as a second input, the oscillator frequency providing the useful output voltage of the apparatus and being under the control of frequency controlling means including a direct current amplifier having an input supplied from the output of the phase detector at lock-in and supplying a direct current output to a controlled reactance operatively connected to the aforementioned oscillator. A feedback phase reversing tube and circuit couple the output of the direct current amplifier to the input thereof and provide for the generation of the sweep voltage, and further provide for stopping the sweep voltage when lock-in occurs and maintaining a direct current output voltage corresponding substantially to the value of the sweep voltage at the time of the lockin, for maintaining the necessary or required voltage on the controlled reactance to provide for continuous operation of the controlled oscillator at the desired frequency.

Accordingly, a primary object of the instant invention is to provide a new and improved automatic frequency control circuit and apparatus.

Another object is to provide a new and improved automatic frequency control circuit of the hunting type with provision for automatic locking.

A further object is to provide a new and improved hunting-type automatic frequency control circuit in which the necessity for a separate sweep voltage generator is dispensed with, and a feedback tube and circuit are provided in conjunction with a direct current amplifier for performing the functions of a sweep generator.

Other objects and advantages will become apparent after a persual of the following specification when read in connection with the accompanying drawings, in which.

Figure 1:
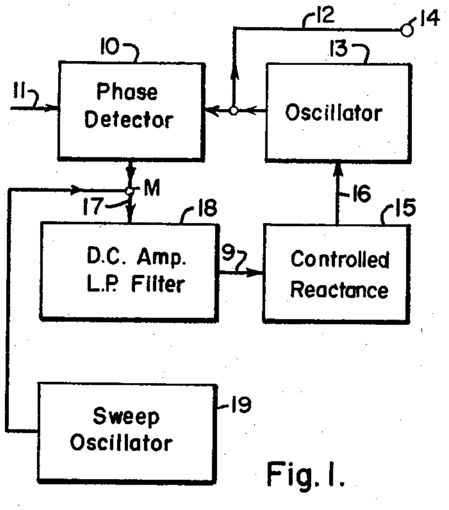
Figure 1 is an electrical circuit diagram in block form of an automatic frequency control circuit of the prior art and is included to assist in explaining the improvements provided by the instant invention.

Particular reference should be made now to the drawings for a more complete understanding of the invention in which like reference numerals are used throughout to designate like parts, and in particular to Fig. 1 thereof. A phase detector 10 has applied thereto on lead means 11 a first voltage of a reference frequency. The phase detector 10 also has applied thereto on lead means 12 a second voltage of a frequency corresponding to the instant frequency of the oscillator 13, lead means 12 also supplying the useful oscillator output to terminal 14. The oscillator 13 has in the circuit thereof a controlled reactance which is shown in block form and generally designated 15, the controlled reactance being connected to the remainder of the oscillator circuit by lead means 16. While the controlled reactance 15 may be either voltage or current controlled, the invention will be described herein with reference to a voltage controlled reactance. The controlled reactance 15 is of the type in which the value of the reactance varies with variations in the amplitude of a direct current voltage or signal applied thereto, and may be of any convenient design such, for example, as a voltage-sensitive capacitor or a reactance tube, the direct current voltage being supplied to controlled reactance 15 by lead means 9. The output of the aforementioned phase detector 10 is applied by lead means 17 to a direct current amplifier and low-pass filter, shown in block form and generally designated 18, which supplies the control voltage on aforementioned lead means 9, and the direct current amplifier 18 is also connected by lead means 17 to a sweep voltage generator shown in block form and generally designated 19. For reasons which will become hereinafter more clearly apparent, lead means 17 may, if desired, be operatively connected to both the input and output circuits of the sweep oscillator 19, and may provide at least a portion of the necessary regenerative feedback path between output and input of generator 19 to provide for the generation of sweep voltage oscillations in 19.

Phase detectors are well known in the art, and a number of circuits are suitable for use at 10, but certain characteristics are desirable in the phase detector. The output thereof may preferably be a substantially direct current voltage when the inputs on leads 11 and 12 are of the same frequency and in phase although some degree of pulsation, ripple, or fluctuation may be permissible. Furthermore, within a preselected range limit, the magnitude of this direct current voltage may be a function of the applied phase difference. By suitable choice of a circuit arrangement and component values, these and other desired operating conditions may be readily met. The output circuit of the phase detector 10 may, if desired, include an R-C filter circuit for reducing or limiting radio frequency components in the output thereof.

In the operation of the aforedescribed prior art apparatus of Fig. 1, the sweep voltage generator 19 may be of any convenient design provided, however, that the generation of the sweep voltage may be stopped, in one of two manners hereinafter to be described.

In the prior art, one way of providing that the sweep voltage generator stops the production of oscillations at lock-in is to employ a generator 19 having a circuit arrangement such that the impedance into which the oscillation generator 19 works is critical; that is, a small change in the load impedance will result in the circuit going out of oscillation. This may conveniently be provided by including a T-type attenuator in the generator circuit 19 in a manner whereby when the effective impedance is lowered the regenerative feedback is lowered to such a value that the sweep voltage stops.

The output impedance of the phase detector 10 changes when the applied voltages on leads 11 and 12 reach or approach frequency equality and phase synchronism and this change in phase detector output impedance which may be effectively in shunt with the internal impedance of oscillator 19 may, by suitable circuit arrangement, be made sufficient to stop the production of the sweep voltage at 19.

In the prior art the stopping of the sweep voltage at 19 at lock-in may result from another effect. It will be noted that the phase detector 10, amplifier 18 and oscillator 13, including controlled reactance 15, provide a closed loop, which may have a gain approaching infinity at zero frequency, the gain falling off rapidly from a maximum gain at or near zero frequency. Accordingly, while generator 19 produces a low frequency sweep voltage at junction M, as the sweep voltage brings oscillator 13 to a point close enough for lock-in, then the low frequency sweep voltage at M will be fed through the frequency control loop and back to point M, amplified, from the output of the phase detector. This voltage from phase detector 10, however, is out of phase with the feedback voltage of generator 19 needed to maintain oscillation in generator 19 if, as aforementioned, lead means 17 is connected to both the input and the output of the sweep oscillator contained in 19 and provides at least a portion of the regenerative feedback path needed to maintain oscillation. Since, as aforementioned, the gain of the frequency control loop may approach infinity near zero frequency, by suitable easy choice of component values, the gain of the frequency control loop may be made to exceed the gain feedback of the generator 19, so that the out-of-phase voltage from phase detector 10 may easily be made sufficiently great to stop oscillation at 19.

The general principles of operation of a phase detector in automatic phase control circuits need not be described in great detail herein, they having been described in the literature of the art, for example, in an article by Donald Richman entitled "Color-Carrier Reference Phase Synchronization Accuracy in NTSC Color Television"; I.R.E. Proceedings, vol. 42, pp. 106–133, January 1954, and further in Microwave Mixers, Radiation Lab. Series, vol. 16, McGraw Hill Book Co., Inc., 1948, ch. 7.

Before lock-in occurs, the voltage output of the sweep generator 19 is amplified by the direct current amplifier 18 and applied as a control voltage to the controlled reactance 15. When the reactance 15 is varied in such a manner as to cause the frequency of oscillator 13 to assume a value which corresponds to the frequency of the reference voltage on lead 11, the aforementioned phase detector 10 causes the sweep generator 19 to stop its oscillation, either by altering the impedance thereof in a critical manner or applying thereto a voltage opposing the feedback voltage required to maintain oscillation.

Figures 3, 4:
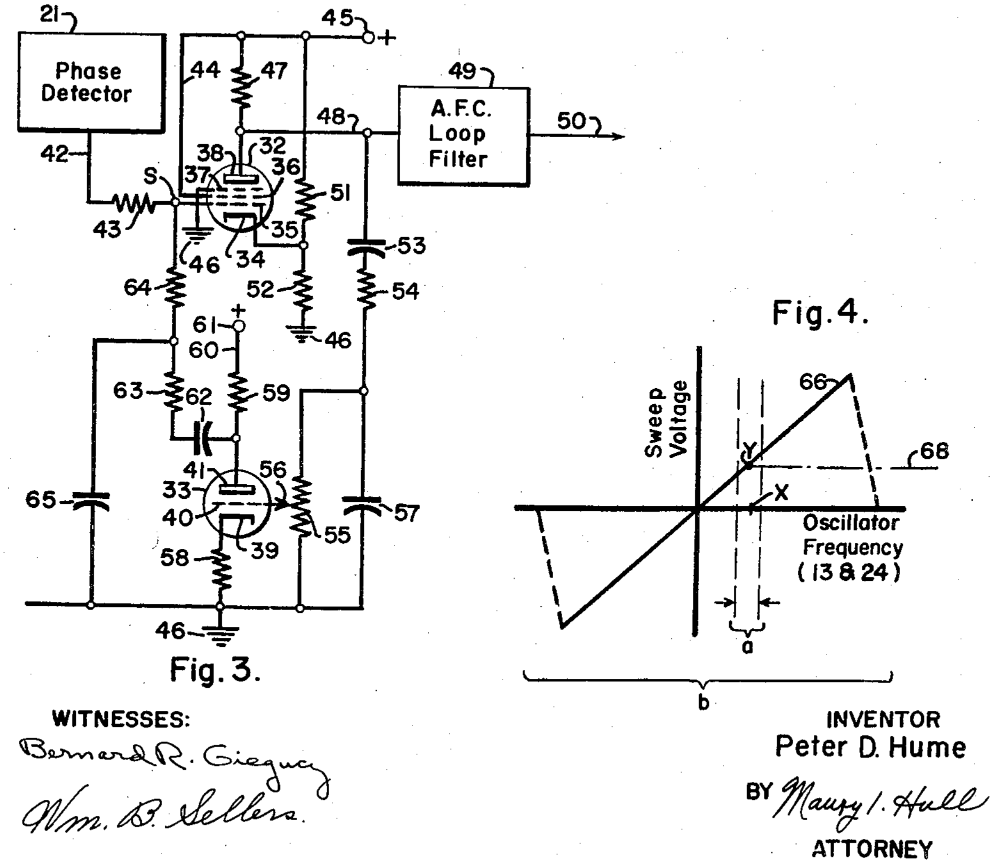
Fig. 3 is a schematic electrical circuit diagram of the direct current amplifier and feedback phase reversing tube circuit portions of the apparatus of Fig. 2 according to the preferred embodiment of the invention.
Fig. 4 is a graph illustrating the operation of the apparatus of Figs. 1, 2 and 3.

The direct current amplifier and low pass filter 18 may be constructed and arranged to maintain a voltage of the correct value on the reactance 15 to maintain the oscillator frequency at the necessary value after the sweep generator 19 has stopped production of the sweep voltage, that is, during lock-in. In Fig. 4, *"a"* is in the range in which lock-in occurs, and *"b"* represents the hold-in range, i.e., the range over which the frequency on lead 11 may be varied without losing the lock once it has been established.

It will be recalled that the voltages from the phase detector 10 and sweep oscillator 19 are opposed at the summing point M, and this results in the phase detector acting to maintain the circuit "status-quo." The phase detector can do this only when signals at 11 and 12 are inside a given range of difference in frequency and phase. If the frequencies at 11 and 12 are substantially different, the phase detector 10 becomes in effect a beat oscillator or beat generator with an alternating current output. The operation of the phase detector in conjunction with a filter for phase synchronization is more fully explained in the hereinbefore referenced article by Mr. Richman.

Should the reference voltage on lead 11 change in frequency after lock-in by a predetermined minimum amount, the change in output of the phase detector 10 may result in a change in voltage or change in the effective impedance shown to the sweep generator 19, causing the generator or oscillator 19 to begin to function again with the result that the value of the reactance 15 is again varied until the frequency and phase of the voltage output of oscillator 13 again substantially coincide with the frequency and phase of the voltage on lead means 11, and the generator 19 again stops its sweep voltage generation.

The prior art circuit of Fig. 1 has certain disadvantages, however. Conditions must be carefully balanced so that the sweep voltage is enough to sweep the range *"b"* in Fig. 4 but not enough to block the direct current amplifier 18.

Furthermore, the low frequency sweep generator or oscillator 19 of, for example, one cycle per second, is not easily made, since an inductor is large and clumsy at such a frequency, and R-C networks tend to block the grid current of their associated electron tube.

Figure 2:
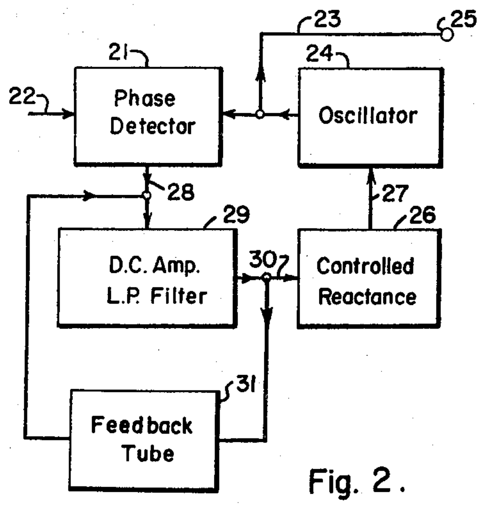
Fig. 2 is an electrical circuit diagram in block form of apparatus embodying the instant invention according to one embodiment thereof.

The improvement provided by the instant invention is illustrated in Fig. 2 and consists, at least in part, in substituting for the sweep generator 19 of Fig. 1 a feedback path including between the output of the direct current amplifier 29 and the input thereof a feedback tube and circuit 31 having certain preselected electrical characteristics.

In Fig. 2, the phase detector, shown in block form and generally designated 21, and which may be similar to aforedescribed phase detector 10, has a reference voltage of a preselected frequency which may be variable within limits applied thereto on lead means 22. Applied to the phase detector 21 on lead means 23 is the output of the oscillator to be controlled, shown in block form and designated 24, the oscillator supplying its useful output to terminal 25 and having as part of the circuit thereof a controlled reactance 26 which may be a voltage-sensitive capacitor or reactance tube connected to the remainder of the circuit by lead means 27, or may be a current controlled reactance. The aforementioned phase detector 21 supplies its output by lead means 28 to a direct current amplifier and low-pass filter 29, the output of the direct current amplifier and low-pass filter 29 being applied by way of lead means 30 to the aforementioned controlled reactance 26. The aforementioned lead means 30 is connected to supply the input to a feedback tube circuit shown in block form and generally designated 31, the output of the feedback tube circuit being connected to the aforementioned lead means 28.

Particular reference should be made now to Fig. 3 in which there is shown a schematic electrical circuit diagram of a direct current amplifier circuit for use at 29 and a feedback tube circuit for use at 31 in Fig. 2. The direct current amplifier is shown in Fig. 3 to include a pentode type electron tube 32, whereas the feedback tube circuit 31 is shown to include the tube 33 which may be a triode. The tube 32 has a cathode 34, control grid 35, screen grid 36, suppressor grid 37 connected to ground, and anode 38. The aforementioned tube 33 has a cathode 39, control grid 40 and anode 41. Phase detector 21 is connected by way of lead 42 to a resistor 43 which may have a value of 1 megohm and thence to the aforementioned control grid 35 of tube 32, a direct current path between grid 35 and cathode 34 being provided through phase detector 21, ground 46 and resistor 52. The junction S on the lead to grid 35 is a summing point, and is designated for purposes which will be hereinafter more clearly apparent. The aforementioned screen grid 36 of tube 32 is connected by lead 44 to the positive terminal 45 of a suitable source of anode potential, not shown, the other or negative terminal of the aforementioned source of anode potential being connected to ground 46. The aforementioned B+ lead 44 is connected by way of resistor 47 and lead means 48 to the aforementioned anode 38. Anode 38 is also connected by way of lead means 48 to supply the input to a filter shown in block form and designated 49, the voltage output of the filter 49 being supplied by way of lead 50 to the controlled reactance 26, not shown in Fig. 3. The aforementioned B+ lead 44 is also connected by way of resistor 51 to the aforementioned cathode 34, and the cathode 34 is connected by way of the aforementioned resistor 52 to ground 46.

Lead 48, which as aforementioned is connected to the anode 38 of tube 32, is connected by way of a coupling capacitor 53 to a resistor 54 which may have a value of 5 megohms and thence by way of a voltage dividing potentiometer 55 which may have a total resistance value of 5 megohms to ground 46. The arm 56 of potentiometer 55 is connected to the aforementioned control grid 40, and potentiometer 55 has the capacitor 57 connected thereacross. The aforementioned cathode 39 is connected by way of resistor 58 to ground 46. The aforementioned anode 41 of tube 33 is connected by way of resistor 59 and lead 60 to the positive terminal 61 of an additional suitable source of direct current anode potential, not shown, the negative terminal of the additional source of direct current anode potential being connected to the aforementioned ground 46. Anode 41 is also connected to capacitor 62 and thence by way of resistors 63 and 64 in series to the junction point S and to the aforementioned grid 35 of tube 32. Resistors 63 and 64 may each have a resistance value of 5 megohms. The junction between resistors 63 and 64 is connected by way of capacitor 65 to ground 46. The arm 56 of potentiometer 55 is adjusted to a position whereat, in the absence of a direct current output signal from phase detector 21 applied to control grid 35, the circuit of tubes 32—33 breaks into self-oscillation.

The operation of the aforedescribed circuit of Fig. 3 will be readily understood when it is recalled that the purpose of the circuit is to supply on lead 50 a variable direct current voltage for controlling the value of the variable reactance 26. While the frequencies of the reference and oscillator signals are equal, the circuit acts as an automatic phase control loop, and the variations in voltage on lead 50 are those which tend to maintain the reference and oscillator signals in phase synchronism. When a frequency difference exists between the voltages on leads 22 and 23 applied to the aforementioned phase detector 21, a voltage change is provided on lead 50 to thereby change the oscillator frequency to a value equal to the reference frequency. Furthermore, it is an object of the apparatus of Figs. 2 and 3 to provide an oscillator circuit which locks automatically on the correct or reference frequency at the correct control voltage value, and which when unlocked is periodically swept in frequency over a preselected frequency range by a sweep generator in order to bring the frequency of oscillator 24 to a value corresponding to the reference or correct frequency, whereupon locking occurs. As aforementioned, at lock-in an automatic phase control loop is provided including phase detector 21, direct current amplifier tube 32, filter 49, controlled reactance 26, and oscillator 24.

Assume for purposes of description, that the voltages on leads 22 and 23 do not have the same frequency, that there is an alternating current signal output of predetermined amplitude from the phase detector 21, and that this output is supplied by way of the aforementioned resistor 43 to the control grid 35 of tube 32, thereby varying the potential on the anode 38 and lead 48. Variations in potential on lead 48 are coupled by way of capacitor 53, resistor 54 and potentiometer 55 to the control grid 40 of tube 33, and the output of tube 33 is coupled back by way of the aforementioned capacitor 62 and series-connected resistors 63 and 64 to the control grid 35 of tube 32, in proper phase to provide positive feedback for providing an oscillatory circuit, and the circuit of tubes 32—33 breaks into self-oscillation at the sweep frequency since the output of the phase detector is no longer a direct current and no longer exerts a restraining influence on the tendency of the circuit of tubes 32—33 to break into self-oscillation. By suitable choice of component values, a sweep voltage may be generated at lead 48 at preferably a very low frequency, such, for example, as one cycle per second, or less. This sweep voltage may, if desired, be either linear or substantially sinusoidal, a linear sweep being illustrated in Fig. 4.

The grid to plate voltage gain of the direct current amplifier including tube 32 may be of the order of 100 out of lock-in, and is dependent on the AFC loop characteristics when in lock. The gain at one cycle per second may be made to be well under unity however, once inside the pull-in range.

In Fig. 4, to which particular reference is now made, the amplitude of the sweep voltage on lead 50 is plotted on one coordinate scale, being represented by the curve 66, and the frequency output of the oscillator 24 as varied by the controlled reactance 26 of Fig. 2 is plotted on the other coordinate scale. It should be understood that the reference point where the coordinate scales cross is artificial, that is, it is chosen to coincide with the point where the sweep voltage 66 crosses an oscillator frequency value which allows substantially optimum frequency adjustment in either direction above or below the chosen point, and that the sweep voltage at lead 50 does not necessarily attain a negative value, although it may do so if desired, and that the coordinate scales chosen have convenient values selected to facilitate description of the invention. In like manner, the oscillator frequency scale may be any selected frequency scale depending upon the characteristics of the oscillator 24. The dashed lines of range "*a*" indicate the range within which the apparatus is adapted to lock-in, and the point designated X in Fig. 4 indicates the exact lock-on frequency chosen for purposes of illustration, and corresponds to the instant frequency on lead 22. The voltage 68 of the curve of Fig. 4 illustrates the direct current voltage output from the circuit of Fig. 3 after lock-on occurs and the automatic phase control loop becomes operative, and the continual application of this voltage of curve 68 to the controlled reactance 26 by way of lead 50 maintains the frequency of the oscillator 24, Fig. 2, at the desired value. The voltage 68 is the output of phase detector 21 as amplified by tube 32, the output of phase detector 21 being, as aforementioned, a direct current while the frequencies of the two signals applied thereto are equal, the amplitude of the direct current varying with variations in the phase angle between the two signals of equal frequency.

Assume now by way of example, that the sweep voltage generated in tubes 32 and 33 and their associated components has attained the value indicated in Fig. 4 by the point Y. At this point the frequency output of the oscillator 24 has attained a value equal to the frequency of the voltage on lead 22 with the result that the output of the phase detector 21 becomes a predetermined characteristic direct current signal and this change stops further generation of sweep oscillations in the circuit of tubes 32 and 33. By suitable choice of component values for the circuits of tubes 33 and 32 and of the phase detector 21, a circuit condition may be made to exist in which a stopping of the further generation of a sweep voltage may be readily accomplished, that is, the voltage output from phase detector 21 assumes such a value as to stop the oscillations in tubes 32 and 33. At the point where the sweep voltage stops under the control of the aforementioned phase detector 21, tube 32 becomes a direct current amplifier, the voltage output of the phase detector 21 being amplified and applied by way of lead 48, filter 49 and lead 50, to the controlled reactance 26.

The aforementioned potentiometer 55 having an adjustable arm 56 is provided for regulating the gain and feedback of the circuit.

Any suitable means, not shown, may be provided for heating the cathodes 34 and 39 of tubes 32 and 33, respectively.

The filter 49 may be of any convenient design and of suitable characteristics, as limited by the A.P.C. loop, but these characteristics do not conflict with the proper operation of the feedback tube oscillation circuit.

In the circuit of Fig. 3, one significant advantage over the prior art is that the amplitude of the sweep voltage 66 can be readily limited by the plate swing of the direct current amplifier, with no grid blocking possible. The range of plate bottom to tube cut-off is precisely that required for the sweep.

The circuit is well adapted for producing very low sweep frequencies, as, for example, when the A.F.C. loop gain is restricted by the filter 49. A sweep frequency of 0.1 cycle/second is easily obtained in practice.

As previously stated herein, if desired, a current-sensitive reactance may be employed at 26 instead of a voltage sensitive or voltage controlled reactance. A current sensitive reactance may be connected in series with resistor 47, Fig. 3.

Whereas the invention has been shown and described with reference to an embodiment thereof which gives satisfactory results, it should be understood that changes may be made and equivalents substituted without departing from the spirit and scope of the invention.

I claim as my invention:

1. In automatic frequency control apparatus, in combination, phase detector means having first and second signals applied thereto, direct current amplifier means, filter means oscillator means including a signal-sensitive variable reactance for producing said first signal and varying the frequency of said first signal, circuit means connecting said phase detector means, said direct current amplifier means, said filter means, and said oscillator means in a closed phase control loop whereby the first signal output of the oscillator means is applied to the phase detector means, the output of the phase detector means is applied to the input of the direct current amplifier means, the output of the amplifier means is applied to the filter means, and the output of the filter means is applied to the signal-sensitive reactance, said phase control loop acting to maintain the first and second signals in phase synchronism while the first and second signals are of the same frequency, and regenerative feedback means connecting the output of the direct current amplifier means to the input thereof, said feedback means and amplifier means being constructed and arranged to generate a sweep signal when the frequency of at least one of said first and second signals varies so that said first and second signals are no longer of the same frequency, said sweep signal being applied by way of said filter means to said signal-sensitive variable reactance to thereby change the frequency of said first signal to the frequency of said second signal.

2. In automatic frequency control apparatus, in combination, a controllable oscillator including a signal controlled reactance, a phase detector operatively connected to said oscillator and having a signal applied thereto from the oscillator, a direct current amplifier including a filter operatively connected to the phase detector and having the output of the phase detector applied thereto, said direct current amplifier being operatively connected to said controlled reactance and applying the direct current signal output therefrom to the controlled reactance for varying the frequency of said oscillator, said phase detector, direct current amplifier, and oscillator forming a closed automatic phase control loop, said phase detector having applied thereto an additional signal of a reference frequency, and feedback means operatively connected in parallel with said direct current amplifier for applying a portion of the signal output of the direct current amplifier after phase reversal to the input of the direct current amplifier, said direct current amplifier and feedback means being constructed and arranged to normally tend to produce low frequency sweep oscillations, said amplifier and feedback means being constructed and arranged whereby said phase detector output, when the signal and additional signal applied to the phase detector have the same frequency and approach phase synchronism, causes the cessation of said sweep oscillations.

3. Automatic frequency control apparatus comprising, in combination, phase detector means, said phase detector means having a voltage of reference frequency applied thereto, oscillator means, said oscillator means being operatively connected to said phase detector means for applying a voltage of oscillator frequency thereto, said phase detector means providing an output of predetermined characteristic which is a direct current while the reference frequency and oscillator frequency are equal and which has an amplitude which varies in accordance with variations in the phase difference between the voltages of reference and oscillator frequencies, said oscillator means including a controllable reactance adapted when a direct current voltage applied thereto is varied to vary the reactance thereof and thereby vary the frequency of the oscillator means, direct current amplifier means including low pass filter means operatively connecting the output of said phase detector means to said controlled reactance whereby an automatic phase control loop is provided which normally acts to maintain the voltage of oscillator frequency and the voltage of reference frequency in phase synchronism, said phase detector means providing a modulation product difference frequency alternating current output while the oscillator voltage and reference voltage are of different frequencies, and feedback means operatively connecting the output of the direct current amplifier means to the input thereof, said direct current amplifier means and feedback means being constructed and arranged to normally oscillate at a low frequency while the phase detector means output is an alternating current, said amplifier means and feedback means being constructed and arranged whereby while the output of said phase detector means is a direct current the oscillations of the feedback means and amplifier means are stopped.

4. Automatic frequency control apparatus comprising, in combination, phase detector means having a signal of reference frequency applied thereto, variable frequency oscillator means including a controlled reactance and operatively connected to said phase detector means for applying an oscillator signal thereto, said phase detector means being constructed and arranged to provide a phase detector output which is a predetermined characteristic direct current while the signal of reference frequency and the signal of oscillator frequency are of substantially the same frequency, said phase detector means providing an alternating current difference frequency output when the signal of reference frequency and the signal of oscillator frequency are of different frequencies, electron discharge tube means normally functioning as a direct current amplifier operatively connected to said phase detector means to receive the output therefrom, low-pass filter means operatively connecting the output of the electron discharge tube means to the controlled reactance to thereby provide a closed automatic phase control loop which acts to maintain the signal of reference frequency and the signal of oscillator frequency in phase synchronism, a change in either the frequency of the reference signal or the frequency of the oscillator signal with respect to the other providing for an alternating current output from said phase detector means applied to said electron discharge tube means, and feedback tube circuit means connecting the output of the electron discharge tube means to the input thereof, said electron discharge tube means and feedback tube circuit means being constructed and arranged to break into self-oscillation and generate a low frequency sweep voltage when the signal applied thereto from the phase detector means is an alternating current, said sweep voltage applied to said controlled reactance changing the oscillator signal frequency to a value equal to the frequency of the reference signal, the output of the phase detector means thereupon becoming a direct current, said direct current applied to said electron discharge tube means stopping oscillation and the generation of a sweep voltage in said electron discharge tube means and tending to maintain the reference signal and oscillator signal in phase synchronism.

5. Automatic frequency control apparatus comprising, in combination, phase detector means having a signal of reference frequency applied thereto, variable frequency oscillator means including a controlled reactance and operatively connected to said phase detector means for applying an oscillator signal thereto, said phase detector means being constructed and arranged to provide an output which is a direct current while the frequencies of the two signals applied thereto are equal, the amplitude of the direct current varying with variations in the phase angle between the two signals of equal frequency, said phase detector means providing an alternating current difference frequency output when the signal of reference frequency and the signal of oscillator frequency are of different frequencies, electron discharge tube means normally functioning as a direct current amplifier operatively connected to said phase detector means to receive the output therefrom, said electron discharge tube means including a first tube having at least an anode, cathode, and a control grid to which the output of said phase detector means is applied, low pass filter means operatively connecting the anode of the first tube to the controlled reactance to thereby provide a closed automatic phase control loop having a predetermined phase synchronization range and which acts to maintain the signal of reference frequency and the signal of oscillator frequency in phase synchronism, a change thereafter in either the frequency of the reference signal or the frequency of the oscillator signal with respect to the other providing for an alternating current output from said phase detector means applied to the control grid of said first tube, feedback tube circuit means including a feedback tube having at least an anode, cathode, and control grid, means operatively connecting the anode of the first tube to the control grid of the feedback tube, and other means operatively connecting the anode of the feedback tube to the control grid of the first tube, the cathodes of both the first tube and the feedback tube being operatively connected to a circuit point of reference potential, the feedback voltage applied to the last named control grid being normally in polarity opposition to the direct current voltage applied thereto from the phase detector means, said electron discharge tube means and feedback tube circuit means being constructed and arranged to break into self-oscillation and generate a low frequency sweep voltage when the signal applied to the control grid of the first tube from the phase detector means becomes alternating current, said sweep voltage applied to said controlled reactance changing the frequency of the oscillator signal to a value equal to the frequency of the reference signal, the output of the phase detector means thereupon becoming a direct current voltage, said last named direct current voltage applied to the control grid of said first electron discharge tube stopping oscillations and the generation of the sweep voltage in said electron discharge tube means at a point whereat the phase of the reference signal and the phase of the oscillator signal are within the phase synchronization range of said automatic phase control loop.

6. Automatic frequency control apparatus comprising, in combination, phase detector means having a signal of reference frequency applied thereto, variable frequency oscillator means including a controlled reactance and operatively connected to said phase detector means for applying an oscillator signal thereto, said phase detector means being constructed and arranged to provide an output which is a direct current while the frequencies of the two signals applied thereto are equal, the amplitude of the direct current varying with variations in the phase angle between the two signals of equal frequency, said phase detector means providing an alternating current difference frequency output when the signal of reference frequency and the signal of oscillator frequency are of different frequencies, electron discharge tube means including a first electron discharge tube having at least an anode, cathode, and a control grid, said electron discharge tube means normally functioning as a direct current amplifier, said control grid being connected to said phase detector means to receive the output therefrom, low pass filter means operatively connecting the anode of the electron discharge tube to the first controlled reactance to thereby provide a closed automatic phase control loop having a predetermined phase synchronization range and which acts to maintain the signal of reference frequency and the signal of oscillator frequency in phase synchronism, a change thereafter in either the frequency of the reference signal or the frequency of the oscillator signal with respect to the other providing for an alternating current output from said phase detector means applied to said control grid, feedback tube circuit means of adjustable gain including a feedback tube having at least an anode, cathode, and control grid, means operatively connecting the anode of the first-electron discharge tube to the control grid of the feedback tube, and other means operatively connecting the anode of the feedback tube to the control grid of the first tube, the cathodes of both the first tube and the feedback tube being operatively connected to a circuit point of reference potential, said electron discharge tube means and feedback tube circuit means being constructed and arranged in accordance with the adjustment of said gain to break into self-oscillation and generate a low frequency sweep voltage when the signal applied thereto from the phase detector means becomes an alternating current, said sweep voltage applied to said controlled reactance changing the frequency of the oscillator signal to a value equal to the frequency of the reference signal, the output of the phase detector means thereupon becoming a direct current having an instant amplitude proportional to the phase difference between the reference signal and the oscillator signal, said last named direct current applied to the control grid of the first electron discharge tube stopping oscillation and the generation of the sweep voltage in said electron discharge tube means at a point where the phase difference between the reference signal and the oscillator signal is within the phase synchronization range of the automatic phase control loop, the phase control loop thereafter acting to maintain the reference signal and the oscillator signal in phase synchronism and frequency equality.

7. Apparatus according to claim 5 wherein the low pass filter means is additionally characterized as having a cutoff frequency such that the phase control loop can act more rapidly than the sweep voltage, whereby the phase control loop is able to catch the transient phase relationship between the reference signal and the swept oscillator signal as it passes through the operating range of the phase detector means.

8. Automatic frequency control apparatus comprising, in combination, phase detector means having a signal of reference frequency applied thereto, variable frequency oscillator means including a controlled reactance and operatively connected to said phase detector means for applying an oscillator signal thereto, said phase detector means being constructed and arranged to provide an output which is a direct current while the frequencies of the two signals applied thereto are equal, the amplitude of the direct current varying with variations in the phase angle between the two signals of equal frequency, said phase detector means providing an alternating current difference frequency output when the signal of reference frequency and the signal of oscillator frequency are of different frequencies, electron discharge tube means including a first tube having at least an anode, cathode, and a control grid, said electron discharge tube means normally functioning as a direct current class A amplifier and having the control grid of said first tube operatively connected to said phase detector means to receive the output therefrom, low pass filter means operatively connecting the anode of the first electron discharge tube to the controlled reactance to thereby provide a closed automatic phase control loop having a predetermined phase synchronization range and which acts to maintain the signal of reference frequency and the signal of oscillator frequency in phase synchronism, a substantial change in either the frequency of the reference signal or the frequency of the oscillator signal with respect to the other providing for an alternating current output from said phase detector means applied to said control grid, positive feedback tube circuit means of adjustable gain including a feedback tube having at least an anode, cathode, and control grid, means operatively connecting the anode of the first electron discharge tube to the control grid of the feedback tube, and other means operatively connecting the anode of the feedback tube to the control grid of the first tube, the cathodes of both the first tube and the feedback tube being operatively connected to a circuit point of reference potential, the feedback voltage developed at the control grid of said first tube, being normally in polarity opposition to the direct current voltage applied to said last-named control grid from said phase detector means, said gain being adjusted to a value whereat the electron discharge tube means and feedback tube circuit means break into self-oscillation and generate a low frequency sweep voltage when the direct current voltage applied thereto from the phase detector means approaches zero amplitude, said sweep voltage applied to said controlled reactance changing the frequency of the oscillator signal to a value equal to the frequency of the reference signal, the output of the phase detector means thereupon becoming a direct current voltage of substantial amplitude, said last named direct current voltage applied to the control grid of said first tube stopping oscillation and the generation of the sweep voltage at a point whereat the phase of the reference signal and the phase of the oscillator signal are within the phase synchronization range of the automatic phase control loop, said automatic phase control loop thereafter acting to maintain the reference signal and the oscillator signal in phase synchronism and frequency equality.

References Cited in the file of this patent

UNITED STATES PATENTS

| | | |
|---|---|---|
| 2,686,877 | Lawson | Aug. 17, 1954 |
| 2,775,703 | Bourgonjon | Dec. 25, 1956 |
| 2,794,918 | Bourgonjon et al. | June 4, 1957 |
| 2,870,330 | Salmet | Jan. 20, 1959 |

FOREIGN PATENTS

| | | |
|---|---|---|
| 1,051,017 | France | May 18, 1955 |